(12) United States Patent
Mori

(10) Patent No.: US 7,706,194 B2
(45) Date of Patent: Apr. 27, 2010

(54) CHARGE PUMP CIRCUIT, SEMICONDUCTOR MEMORY DEVICE, AND METHOD FOR DRIVING THE SAME

(75) Inventor: Toshiki Mori, Osaka (JP)

(73) Assignee: Panasonic Corporation, Osaka (JP)

( * ) Notice: Subject to any disclaimer, the term of this patent is extended or adjusted under 35 U.S.C. 154(b) by 104 days.

(21) Appl. No.: 12/108,948

(22) Filed: Apr. 24, 2008

(65) Prior Publication Data

US 2008/0266968 A1    Oct. 30, 2008

(30) Foreign Application Priority Data

Apr. 24, 2007    (JP) .............................. 2007-113820

(51) Int. Cl.
*G11C 5/14* (2006.01)

(52) U.S. Cl. ............................ 365/189.09; 365/185.18; 365/226

(58) Field of Classification Search ............ 365/189.09, 365/189.011, 185.18, 185.19, 185.24, 226; 327/536–537
See application file for complete search history.

(56) References Cited

U.S. PATENT DOCUMENTS

| | | | | |
|---|---|---|---|---|
| 5,375,083 A | * | 12/1994 | Yamaguchi | ............ 365/185.27 |
| 6,115,313 A | * | 9/2000 | Pio | ............................. 365/228 |
| 6,222,779 B1 | * | 4/2001 | Saito et al. | ............. 365/189.09 |
| 6,842,383 B2 | | 1/2005 | Shor et al. | |
| 2002/0003724 A1 | | 1/2002 | Tanzawa et al. | |
| 2005/0127981 A1 | * | 6/2005 | Lee et al. | ..................... 327/536 |
| 2005/0207236 A1 | | 9/2005 | Yamazoe et al. | |
| 2007/0217272 A1 | * | 9/2007 | Albano et al. | .......... 365/189.09 |

* cited by examiner

*Primary Examiner*—Gene N. Auduong
(74) *Attorney, Agent, or Firm*—McDermott Will & Emery LLP

(57) ABSTRACT

A semiconductor memory device includes: a memory cell array including a plurality of memory cells arranged in rows and columns for holding information, each of the memory cells having a control gate; a plurality of word lines extending in a row direction, each of the word lines being connected to the control gates of the memory cells of a corresponding row of the memory cell array; a plurality of bit lines extending in a column direction and connected to sources or drains of the memory cells; a row decoder for selecting any of the plurality of word lines; a column decoder for selecting any of the plurality of bit lines; a charge pump circuit for generating a voltage higher than a supply voltage; and a first switch located in a connection path between the row decoder and the charge pump circuit.

13 Claims, 11 Drawing Sheets

Cell equivalent circuit

Reading/writing verification/ erasure verification bias

Writing bias

Erasure bias

Cell equivalent circuit

Reading/writing verification/erasure verification bias

Writing bias

Erasure bias

CHARGE PUMP CIRCUIT, SEMICONDUCTOR MEMORY DEVICE, AND METHOD FOR DRIVING THE SAME

BACKGROUND OF THE INVENTION

1. Field of the Invention

The present invention relates to a bias generator for generating a bias to be applied in a semiconductor memory device, such as a flash memory, or the like, and to a method for controlling such a bias generator.

2. Description of the Prior Art

Flash memories, which form a class of nonvolatile semiconductor memory device, are roughly divided into floating gate flash memories, which have a conductive floating gate located between a control gate and a semiconductor substrate and surrounded by an oxide film, and MONOS flash memories, which have an insulation film between a control gate and a semiconductor substrate, the insulation film being formed by an oxide film, nitride film, and oxide film in this order from the lower layer to the upper layer, wherein charge trapped by the nitride film serves as memory information.

In the MONOS flash memory, the nitride film for trapping the charge is an insulation film, and therefore, locally trapping the charge is possible. Charges are accumulated at opposite sides of a trap layer, whereby memorization of two-bit information is possible using different regions of one memory cell. Thus, the MONOS flash memory has been joining the mainstream of the nonvolatile bulk memory.

FIG. 9 is a cross-sectional view of a MONOS flash memory cell which has a trap layer. The MONOS flash memory cell includes impurity diffusion regions 1902 and 1904 in the upper part of P-type semiconductor substrate 1900, which form N-type source or drain, and a first silicon oxide film 1906, a silicon nitride film 1908, a second silicon oxide film 1910, and a conductive control gate 1912 sequentially deposited on a channel region between the impurity diffusion regions 1902 and 1904.

The silicon nitride film 1908 works as a trap layer to retain information by means of trapping charge. Referring to FIG. 9, the silicon nitride film 1908 includes charge trapping regions 1914 and 1916 at opposite sides (i.e., two positions), with which retaining two-bit information in one memory cell is possible.

To locally trapping charges in two different regions of one memory cell, typical MONOS flash memories employ electron injection into the trap layer with channel hot electron for the data-writing mechanism (CHE writing) and hole injection by means of band-to-band tunneling injection (BTBT injection) for the data-erasing mechanism such that charges trapped at the opposite sides of the silicon nitride film 1908 are neutralized.

TABLE 1 shows the voltages applied to a MONOS memory cell in respective operation modes. In this example, the source and drain terminals have potential relationship and current direction in respective operation modes which are defined as reference. According to the terminal definition employed in this example, the source and drain terminals in the same memory cell are replaced by each other as the reading operation mode and the writing operation mode are switched from one to the other. The sense potential, which is the source potential during writing verification and erasure verification operations, refers to the potential at which a selection bit line constituting the source of a memory cell from which data is to be read is charged by the cell current of a selected memory cell.

TABLE 1

|  | Source | Control Gate | Drain |
|---|---|---|---|
| Reading | Sense potential | 4 V | 1.3 V |
| Writing | 0 V | 10 V | 4 V to 7 V |
| Writing verification | Sense potential | 6 V | 1.3 V |
| Erasure | Float | −4.5 V | 4 V to 7 V |
| Erasure verification | Sense potential | 3 V | 1.3 V |

In the writing operation, a high voltage of about 10 V is applied to the control gate for CHE writing while a stepped voltage, which is increased stepwise at every writing cycle from about 4 V to about 7 V, is applied to the drain. In the erasure operation, a negative voltage of about −4.5 V is applied to the control gate for BTBT injection, while a stepped voltage, which is increased stepwise at every erasure cycle from about 4 V to about 7 V, is applied to the drain. In the reading operation, to obtain a necessary cell current, a voltage of about 4 V is applied to the control gate while a voltage of about 1.3 V is applied to the drain.

FIG. 10 shows the timing of applying a voltage to the memory cell in the writing operation. At time t1, data-write signal Co_WE for controlling the writing operation transitions to "L" level so that the operation is set to the writing mode, and accordingly, control gate potential VCG is set to a high voltage of about 10 V. Then, at time t2 at which control gate potential VCG is set to about 10 V, drain potential VBL is set to about 4 V.

At time t3, data-write signal Co_WE transitions to "H" level to end one writing cycle. Accordingly, control gate potential VCG is set to a potential of about 6 V for verification of writing. The drain terminal, to which a potential of about 4 V is applied during the writing operation, is used as the source terminal during the writing verification operation, and source potential VBL is set to 0 V. The drain voltage unshown is set to a voltage of about 1.3 V.

In the writing verification operation, if the writing level is judged as being unreached, the writing cycle that starts at time t1 is repeated. In this process, drain potential VBL is set to a higher potential by one step.

Setting of the control gate potential in the writing operation thus occurs prior to setting of the drain voltage such that the writing operation is started after the control gate potential is set to a target potential in order to prevent deterioration in endurance characteristics. The deterioration in endurance characteristics would occur if the writing operation be carried out in a transient potential state where the control gate potential rises so that an electron trapping region would be enlarged.

FIG. 11A shows a memory cell. FIG. 11B to FIG. 11D are circuit diagrams showing the types of charge pump circuits and regulators necessary for generating the potentials which are to be applied to the memory cell 1200 in respective operation modes shown in TABLE 1. In the writing verification and erasure verification operations illustrated in FIG. 11B, the potential of about 1.3 V which is to be applied to the drain is generated by a bit line potential generation circuit 1104 based on supply voltage (VDD) and applied via a reading bias transistor 1105. The gate voltage of about 4 V to 6 V is set by a gate potential regulator 1106 based on the HV potential generated by a HV charge pump circuit 1100 which is higher than the supply voltage.

In the writing operation illustrated in FIG. 11C, the stepped potential of about 4 V to 7 V which is to be applied to the drain is set by a drain potential regulator 1108 based on the HV potential generated by the HV charge pump circuit 1100. The control gate potential of about 10 V is derived from HHV potential generated by a HHV charge pump circuit 1102 which is higher than the potential generated by the HV charge pump circuit 1100.

In the erasure operation illustrated in FIG. 11D, the stepped potential of about 4 V to 7 V, which is to be applied to the drain, is set by the drain potential regulator 1108 based on the HV potential generated by the HV charge pump circuit 1100 as is in the writing operation. The potential of about −4.5 V which is to be applied to the control gate is generated by a negative potential generation circuit 1110.

FIG. 12 shows an example of the circuit structure of a flash memory 1300 which includes the MONOS cells shown in FIG. 9. The flash memory 1300 includes a memory cell array 1402 to which a virtual ground array (VGA) suitable to a bulk memory is applied.

The memory cell array 1402 is formed by memory cells arranged in an array of rows and columns. The control gates of the memory cells in the same rows are connected to common word lines WL0 and WL1. Any of the word lines is selected by a row decoder 1414 according to an input address. The sources and drains of the memory cells of the same rows are connected together and connected to bit lines BL0 to BL3. Any of the bit lines is selected by a column selection gate 1406 which is controlled based on selection signals YG0 to YG3 that the column decoder 1416 outputs according to the input address and by a source-drain selection gate 1407 which is controlled based on selection signals SD0 and SD1 that the source-drain decoder 1418 outputs according to the input address.

In the reading operation, writing verification operation and erasure verification operation, the operation of the HHV charge pump circuit 1102 and the negative potential generation circuit 1110 is halted so that the output potential of the HHV charge pump circuit 1102 is at the level of the supply potential, and the output potential of the negative potential generation circuit 1110 is at the level of the ground potential. The potential of about 4 V to 6 V which is to be applied to the control gate of a selected memory cell is set by the gate potential regulator 1106 based on the HV potential which is higher than the supply voltage generated by the HV charge pump circuit 1100. The multiplexer 1422 selects this potential and supplies the selected potential to the positive-side power supply node of the row decoder 1414, whereby the selected word line is set to the potential of about 4 V to 6 V. The potential of about 1.3 V, which is to be applied to the drain of the selected memory cell, is derived from a potential generated by the bit line potential generation circuit 1104 based on the supply voltage and is supplied to the selected memory cell via a reading bias transistor 1105, the source-drain selection gate 1407, and the column selection gate 1406. Reading of memory data from a memory cell is carried out by a sense amplifier 1408 comparing the potential of a bit line selected via the column selection gate 1406 and the source-drain selection gate 1407 with reference potential VREF. The result of the comparison, Sout, is output to an external device.

In the writing operation, the HV charge pump circuit 1100 and the HHV charge pump circuit 1102 are activated while the negative potential generation circuit 1110 is halted such that the output potential of the negative potential generation circuit 1110 is at the level of the ground potential. The potential of about 10 V, which is to be applied to the control gate of the selected memory cell, is derived from the output potential of the HHV charge pump circuit 1102 selected by the multiplexer 1422. The multiplexer 1422 supplies the selected potential to the positive-side power supply node of the row decoder 1414 as the potential of the selected word line. The potential of about 4 V to 7 V, which is to be applied to the drain of the selected memory cell, is derived from the output of a data writing circuit 1412 which receives a potential set by the drain potential regulator 1108 based on the output potential of the HV charge pump circuit 1100. The output of a data writing circuit 1412 is supplied to the selected bit line via the source-drain selection gate 1407 and the column selection gate 1406. Meanwhile, the supply voltage of the column decoder 1416 and the source-drain decoder 1418 is the output potential of the HHV charge pump circuit 1102 selected by a multiplexer 1424, and the selection control signal potential of the column selection gate 1406 and the source-drain selection gate 1407 is at the level of the output potential of the HHV charge pump circuit 1102. With this arrangement, the potential of about 4 V to 7 V which is the output of the data writing circuit 1412 can efficiently be transferred to the bit line. The source of the selected memory cell is grounded by making a switch 1410 conducting, the switch 1410 being connected to a selected bit line via the source-drain selection gate 1407 and the column selection gate 1406.

In the erasure operation, the HV charge pump circuit 1100, the HHV charge pump circuit 1102 and the negative potential generation circuit 1110 are activated. The negative potential of about −4.5 V which is to be applied to the control gate of the selected memory cell is derived from the output of the negative potential generation circuit 1110, which is supplied to the negative-side power supply node of the row decoder 1414 and set as the potential of the selected word line. The potential of about 4 V to 7 V which is to be applied to the drain of the selected memory cell is set by supplying the output of the data writing circuit 1412 to the selected bit line via the source-drain selection gate 1407 and the column selection gate 1406. The data writing circuit 1412 receives the potential set by the drain potential regulator 1108 that receives the output potential of the HV charge pump circuit 1100. Meanwhile, the supply voltage of the column decoder 1416 and the source-drain decoder 1418 is the output potential of the HHV charge pump circuit 1102 selected by the multiplexer 1424 as in the writing operation. The source of the selected memory cell is rendered floating by turning off the switch 1410 which is connected to the selected bit line via the source-drain selection gate 1407 and the column selection gate 1406.

The voltage generation control and timing control for switching of the charge pump circuits and multiplexers in the respective operation modes are realized based on an internal control signal output from a controller 1426.

Referring to FIG. 11C, the flash memory needs a plurality of higher voltages for rewriting operations and therefore requires a plurality of charge pump circuits, e.g., the HV charge pump circuit 1100, the HHV charge pump circuit 1102 and the negative potential generation circuit 1110. Thus, the size of the peripheral circuit other than the memory cell array is large as compared with the other memory types. Especially in a chip having a small memory capacity, the size occupancy of the peripheral circuit relative to the chip size is large, which constitutes a factor of an increase in cost. In view of such, in order to suppress the increase in chip size because of the charge pump circuits in the nonvolatile memory, Japanese Laid-Open Patent Publications Nos. 2001-338493, 2001-338493 and 2005-176590 disclose the techniques of generating a plurality of voltages by one charge pump circuit.

SUMMARY OF THE INVENTION

The HHV charge pump circuit 1102 of the MONOS flash memory which employs the CHE writing scheme needs to generate a very high voltage of about 10 V. The node driven is the control gate of a memory cell, which is a capacitive load. Therefore, the HHV charge pump circuit 1102 exhibits the output potential to load current characteristic as represented by line A in FIG. 13 and has a circuit structure capable of generating a high voltage of 10 V or higher with a small driving current. For example, a circuit structure is employed wherein a number of pump units, each having a small pumping capacity, are connected in series.

On the other hand, the HV charge pump circuit 1100 generates a voltage of about 7 V which is to be applied to the drain for supplying the writing channel current of a memory cell. As represented by line B in FIG. 13, the HV charge pump circuit 1100 needs to generate the voltage of about 7 V while supplying the necessary driving current (2 mA in the example of FIG. 13). The number of pump stages of the HV charge pump circuit 1100 is smaller than that of the HHV charge pump circuit 1102, but the HV charge pump circuit 1100 has a circuit structure having a large pumping capacity in order to secure a necessary current drivability.

Therefore, considering a case where the HHV charge pump circuit 1102 and the HV charge pump circuit 1100 are realized by a common charge pump circuit, the potential of about 10 V and the potential of about 4 V to 7 V, which are necessary for the writing operation in one charge pump circuit, need to be respectively output. The charge pump circuit needs to have such characteristics that the potential of 10 V or higher which is to be applied to the gate can be generated even while supplying the necessary driving current as illustrated by line C. The charge pump circuit cannot simultaneously have the above two characteristics without employing the structure of a charge pump circuit including a large number of pump stages and having such a large pumping capacity that the necessary current drivability is secured. Thus, in such a structure where the potential generated by the HHV charge pump circuit 1102 and the potential generated by the HV charge pump circuit 1100 are generated by a single charge pump circuit, the size of the charge pump circuit is disadvantageously larger so that the effect of reduction in chip size decreases, or use of the single charge pump circuit disadvantageously leads to an increase in chip size.

An objective of the present invention is to provide a charge pump circuit for efficiently driving a plurality of nodes that require different current supply capacities with different potentials using one charge pump circuit and a semiconductor memory device including the charge pump circuit.

To achieve the above objective, according to one aspect of the present invention, there is provided a semiconductor memory device that includes: a memory cell array including a plurality of memory cells arranged in rows and columns for holding information, each of the memory cells having a control gate; a plurality of word lines extending in a row direction, each of the word lines being connected to the control gates of the memory cells of a corresponding row of the memory cell array; a plurality of bit lines extending in a column direction and connected to sources or drains of the memory cells; a row decoder for selecting any of the plurality of word lines; a column decoder for selecting any of the plurality of bit lines; a charge pump circuit for generating a voltage higher than a supply voltage; and a first switch located in a connection path between the row decoder and the charge pump circuit.

With the above structure, the first switch is made conducting as necessary in writing, whereby the power supply node of the row decoder can be charged. Thus, it is not necessary to directly output a high voltage necessary for writing of data to the control gate with the first switch being nonconducting. Therefore, a pumped voltage can be supplied to the control gate, and a predetermined voltage can be supplied to a bit line, while the increase in circuit area is suppressed.

The semiconductor memory device may further include a control circuit for controlling the operation of the row decoder, column decoder, first switch, and other elements.

According to another aspect of the present invention, there is provided a semiconductor memory device that includes: a memory cell array including a plurality of memory cells arranged in rows and columns for holding information, each of the memory cells having a control gate; a plurality of word lines extending in a row direction, each of the word lines being connected to the control gates of the memory cells of a corresponding row of the memory cell array; a plurality of bit lines extending in a column direction and connected to sources or drains of the memory cells; a row decoder for selecting any of the plurality of word lines; a column decoder for selecting any of the plurality of bit lines; a charge pump circuit for generating a first voltage higher than a supply voltage and a second voltage lower than the first voltage, the charge pump circuit including a first pump block which includes a plurality of first pump units connected in series for pumping an input voltage and an output section, each of the first pump units having a first pumping capacity; and a second pump block which includes a plurality of second pump units connected in series for pumping an input voltage and an output section, each of the second pump units having a second pumping capacity; and a switch located in a connection path between the row decoder and the charge pump circuit.

With the above structure, the charge pump circuit is capable of supplying two different magnitudes of voltages.

A charge pump circuit of the present invention, for generating a first voltage higher than a supply voltage and a second voltage lower than the first voltage, includes: a first pump block including a plurality of first pump units connected in series for pumping an input voltage and an output section, each of the first pump units having a first pumping capacity; and a second pump block including a plurality of second pump units connected in series for pumping an input voltage and an output section, each of the second pump units having a second pumping capacity.

This charge pump circuit is capable of outputting two different magnitudes of voltages and is therefore preferably used as, for example, a charge pump circuit for a semiconductor memory device.

A semiconductor memory device driving method of the present invention is adapted to drive a semiconductor memory device that includes a memory cell array including a plurality of memory cells arranged in rows and columns for holding information, each of the memory cells having a control gate, a plurality of word lines extending in a row direction, each of the word lines being connected to the control gates of the memory cells of a corresponding row of the memory cell array, a plurality of bit lines extending in a column direction and connected to sources or drains of the memory cells, a row decoder for selecting any of the plurality of word lines, a column decoder for selecting any of the plurality of bit lines, a charge pump circuit for generating a voltage higher than a supply voltage, and a switch located in a connection path between the row decoder and the charge pump circuit, the method including the steps of: (a) in writing of data in the memory cell, making the switch conducting to charge a power supply node of the row decoder; and (b) after step (a), making the switch nonconducting to supply a pumped output of the charge pump circuit to the selected word line for writing of data.

With step (a), the power supply node of the row decoder is charged so that a voltage equal to or higher than the output voltage of the charge pump circuit can be supplied to the control gate. Thus, the area of the charge pump circuit can be reduced as compared with conventional ones. Furthermore, the output of the charge pump circuit can be supplied to the bit line, and therefore, the semiconductor memory device can be driven by one charge pump circuit.

DESCRIPTION OF THE PREFERRED EMBODIMENTS

Hereinafter, embodiments of the present invention will be described with reference to the drawings. The embodiments described below are merely examples, to which the present invention is not limited.

Embodiment 1

Figure 1A:
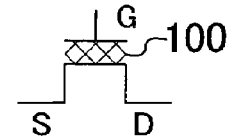
FIG. 1A shows a memory cell used in a semiconductor memory device according to embodiment 1 of the present invention.
Figure 1B:
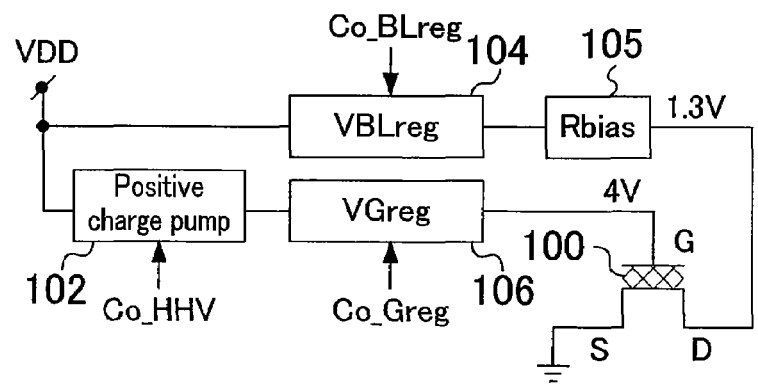
FIG. 1B to FIG. 1D show charge pump circuits and regulators necessary for generating potentials which are to be applied to a memory cell in respective operation modes.
Figure 1C:
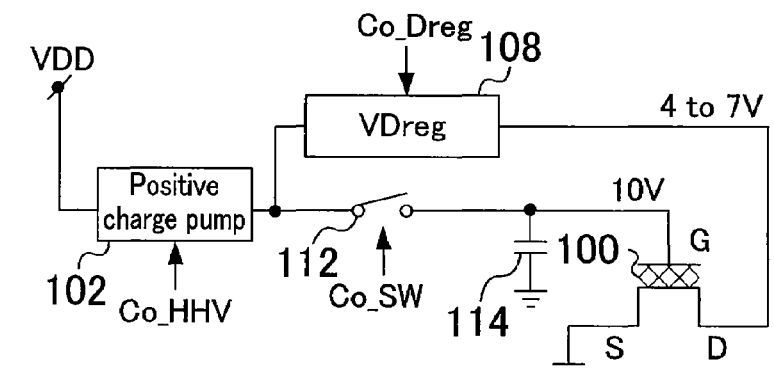
Figure 1D:
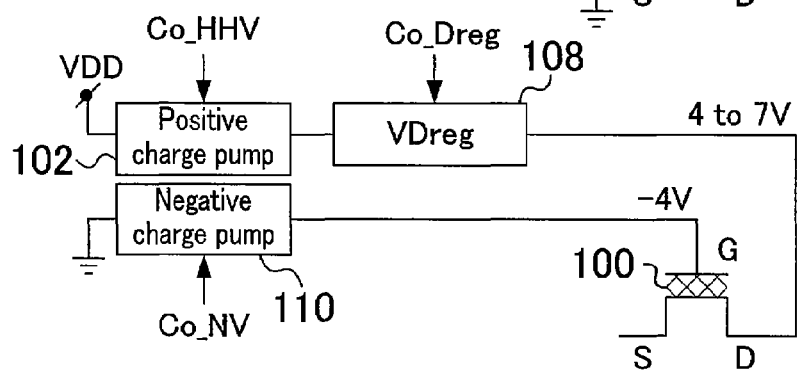

FIG. 1A shows a memory cell 100 of a semiconductor memory device according to embodiment 1 of the present invention. FIG. 1B to FIG. 1D show charge pump circuits and regulators necessary for generating potentials which are to be applied to the memory cell 100 in respective operation modes. The memory cell 100 is a flash memory, such as MONOS, or the like, and employs the potentials applied to respective parts in the respective operation modes which are equal to those of the conventional example shown in TABLE 1.

Referring to FIG. 1B, in the reading operation, writing verification operation and erasure verification operation, the potential of about 1.3 V, which is to be applied to the drain, is a potential generated by the bit line potential generation circuit 104 based on supply voltage VDD and supplied via a reading bias transistor 105. The gate voltage of about 4 V to 6 V is set by a gate potential regulator 106 based on a positive pumped potential generated by a positive charge pump circuit 102 that generates a higher potential than supply voltage VDD.

In the writing operation illustrated in FIG. 1C, the control gate potential of about 10 V is derived from a positive pumped voltage generated by the positive charge pump circuit 102 and supplied via a switch 112. The stepped potential of about 4 V to 7 V which is to be applied to the drain is set by a drain potential regulator 108 based on the positive pumped potential generated by the positive charge pump circuit 102. The potential of about 10 V which is to be applied to the control gate is maintained by means of a capacitor 114 even during a period where the switch 112 is open.

In the erasure operation illustrated in FIG. 1D, the stepped potential of about 4 V to 7 V which is to be applied to the drain is set by the drain potential regulator 108 based on the positive pumped potential generated by the positive charge pump circuit 102 as is in the writing operation. The potential of about −4.5 V which is to be applied to the control gate is the NV potential generated by a negative potential generation circuit 110.

The semiconductor memory device of this embodiment is different from the conventional example of FIG. 11 in that one charge pump circuit is used during the writing operation as illustrated in FIG. 1C and that the switch 112 and a capacitor 114 are located between the positive charge pump circuit 102 and the control gate.

Figure 2:
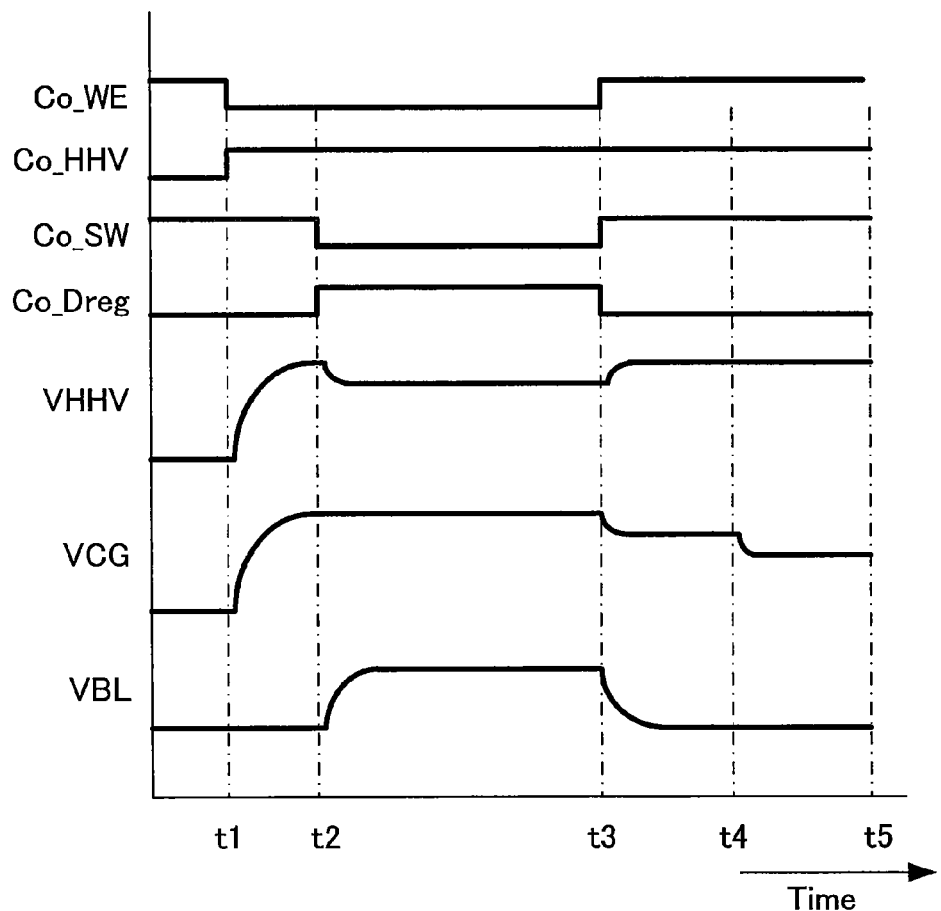
FIG. 2 is a timing chart illustrating the operation timing for writing in a semiconductor memory device of embodiment 1.

FIG. 2 is a timing chart for the writing operation in the semiconductor memory device of this embodiment. At time t1, write control signal Co_WE transitions to "L" level so that the operation is set to the writing mode. Accordingly, positive charge pump circuit control signal Co_HHV which is to be input to the positive charge pump circuit 102 transitions to "H" level, and the positive charge pump circuit 102 starts a pumping operation so that output potential VHHV of the positive charge pump circuit 102 increases. Meanwhile, the control signal to the switch 112, Co_SW, is "H" level so that the switch 112 is conducting. The capacitor 114 is charged to the potential of about 10 V such that control gate potential VCG is a high voltage of about 10 V as high as the output of the positive charge pump circuit 102, VHHV.

At time t2 where the capacitor 114 is charged to a high voltage of about 10 V, the control signal to the switch 112, Co_SW, transitions to "L" level so that the switch 112 is opened, and the control signal to the drain potential regulator, Co_Dreg, is "H" level so that the voltage of about 4 V, which is a stepped voltage for CHE writing, is applied to the drain of a memory cell as illustrated by the waveform of VBL. With application of this voltage, a channel current for CHE writing is supplied to a memory cell in which data is to be written from the positive charge pump circuit 102 via the drain potential regulator 108. As the positive charge pump circuit 102 supplies the channel current, the output potential of the positive charge pump circuit 102, VHHV, decreases while the potential of the control gate of the memory cell, VCG, remains at a high voltage of about 10 V due to the charge of the capacitor 114.

At time t3, write control signal Co_WE transitions to "H" level so that one writing cycle is completed. Control gate potential VCG is set by the gate potential regulator 106 to about 6 V for verification of writing. Potential VBL serves as the source potential during the reading operation and is therefore set to 0 V. In the writing verification operation, if the writing level is judged as being unreached, the above-described writing cycle that starts at time t1 is repeated such that it starts at time t4. In this case, drain potential VBL is set to a higher potential by one step.

Figure 3:
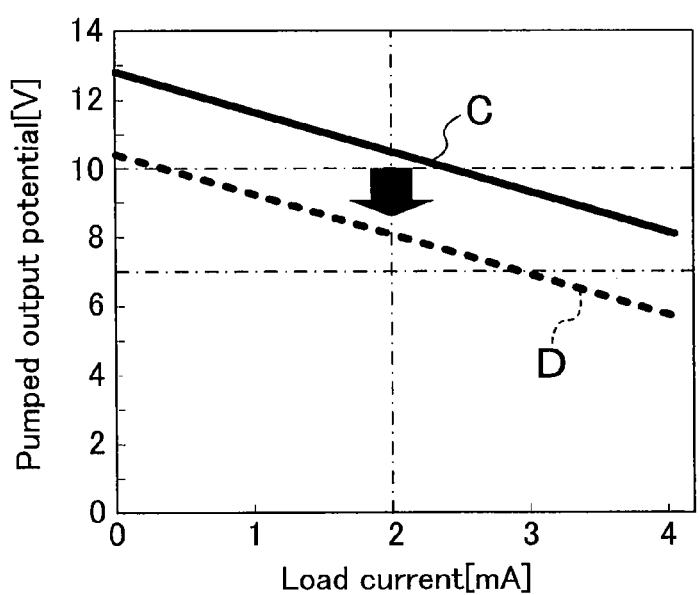
FIG. 3 shows the characteristics of a positive charge pump circuit of FIG. 1B to FIG. 1D.
Figure 13:
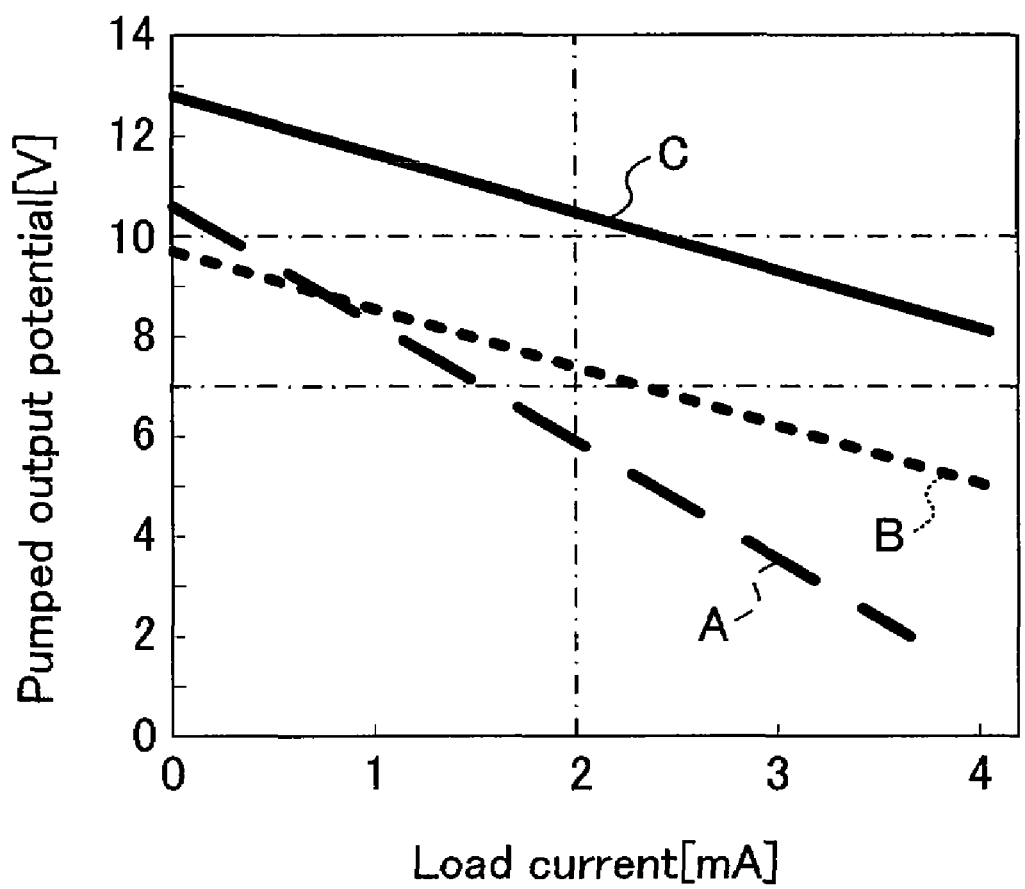
FIG. 13 illustrates the characteristics of a conventional charge pump circuit.

Thus, in the interval between t2 and t3 where supply of a channel current to a memory cell for CHE writing is necessary (see FIG. 2), the potential of about 10 V which is to be applied to the control gate is retained by the charge of the capacitor 114. Thus, the output potential necessary for the positive charge pump circuit 102 may be lower than the potential applied to the control gate and may be equal to or higher than the voltage of 4 V to 7 V that is to be applied to the source of the memory cell. Therefore, the pumped output to load current characteristic necessary for the positive charge pump circuit 102 may satisfy the relationship of broken line D of FIG. 3. In FIG. 3, solid line C represents the pumped output to load current characteristic of the conventional example of FIG. 13. In the charge pump circuit having the characteristic represented by broken line D, the current drivability can be set to a small value so that the pumping capacity can be decreased, as compared with a case where the characteristic represented by solid line C is realized. Thus, in the semiconductor memory device of this embodiment, the positive charge pump circuit 102 can have a smaller size than the conventional one.

Embodiment 2

The second embodiment of the present invention described in this section is a semiconductor memory device that can realizes the respective operation modes illustrated in FIG. 1B to FIG. 1D with no increase in circuit area as compared with the circuit structure examples which realize the respective operation modes as described in FIG. 1B to FIG. 1D.

Figure 4:
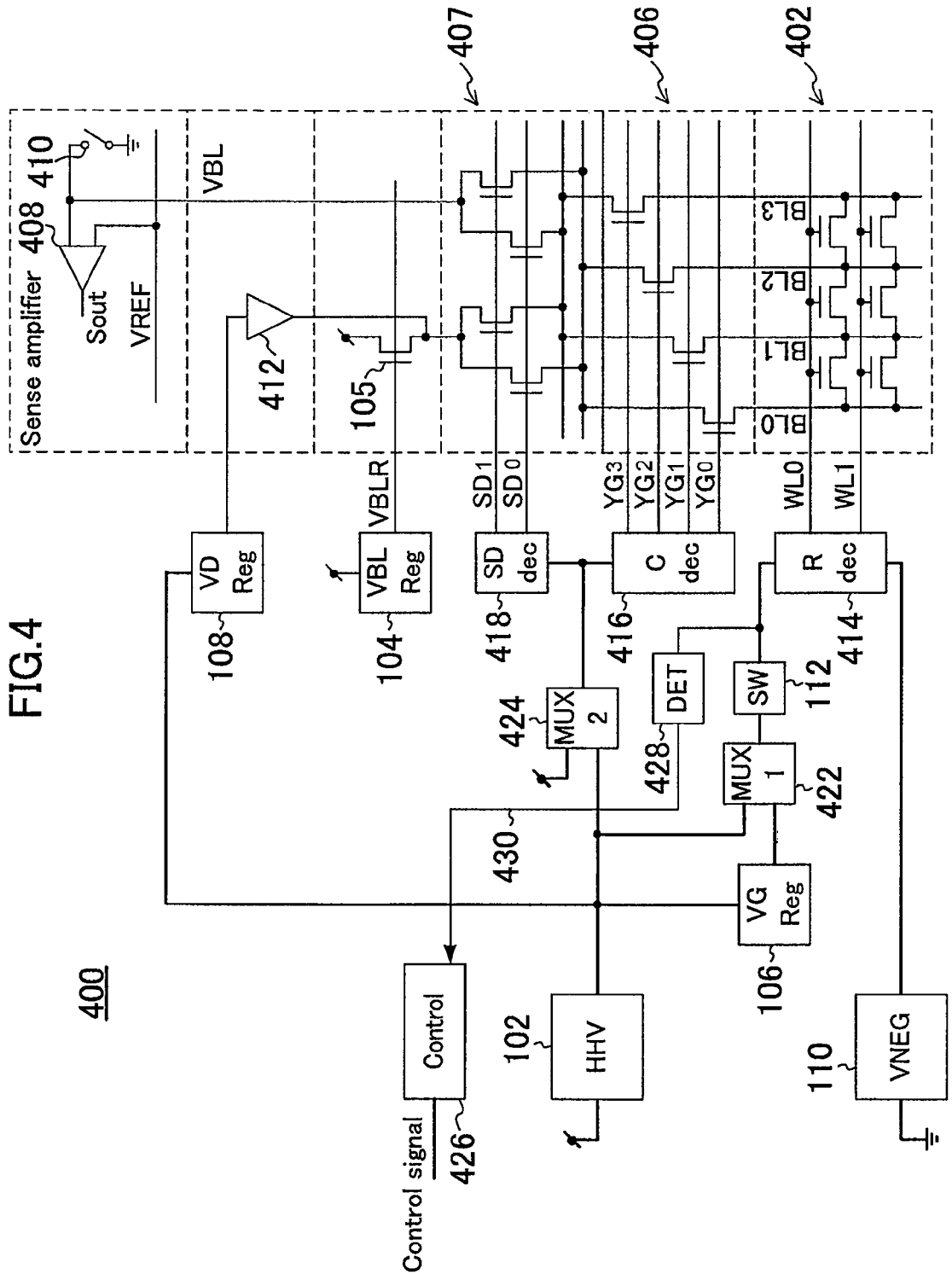
FIG. 4 shows a circuit structure example of a semiconductor memory device of embodiment 2 including MONOS cells of FIG. 9.
Figure 9:
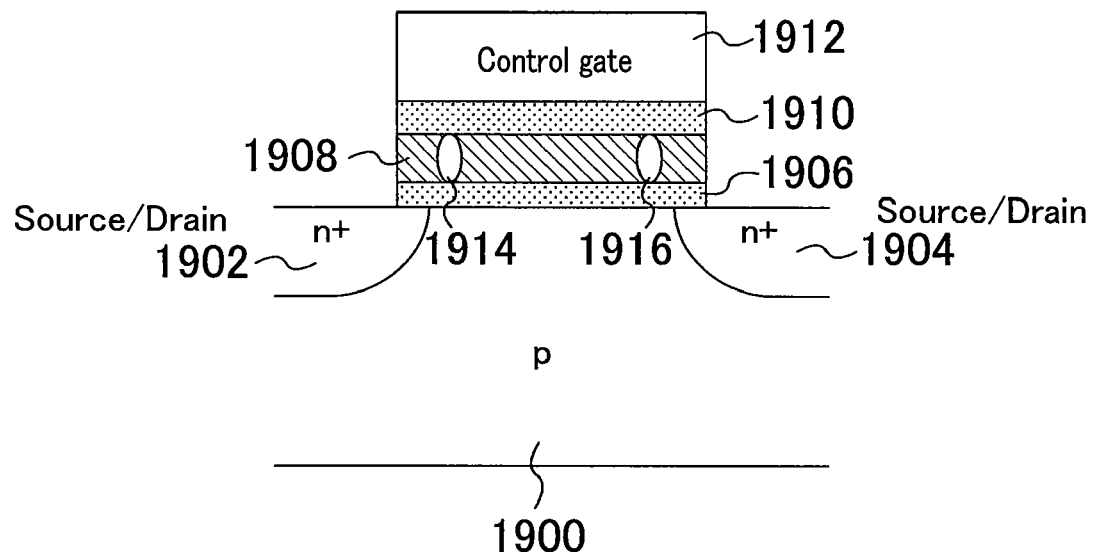
FIG. 9 shows a cross-sectional structure of a MONOS flash memory cell having a trap layer.
Figure 10:
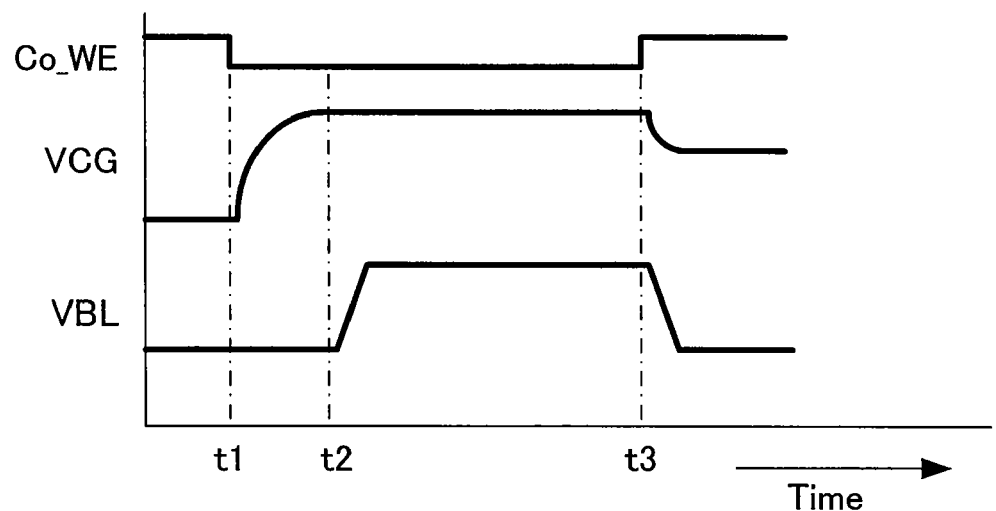
FIG. 10 shows the timing of applying a voltage to a memory cell in the writing operation.
Figure 11A:
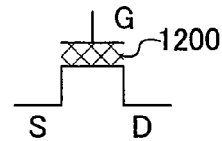
FIG. 11A shows a memory cell.
Figure 11B:
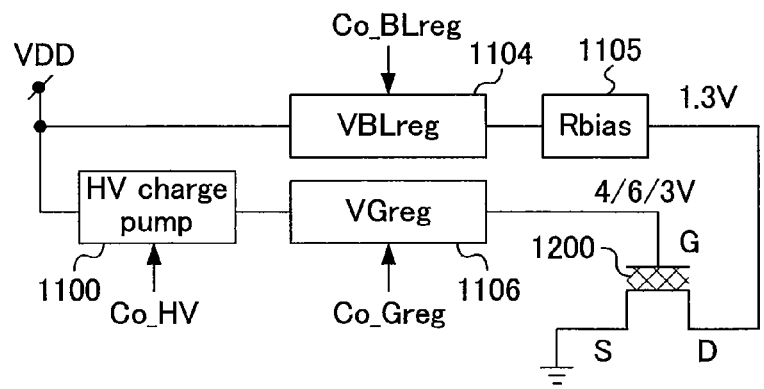
FIG. 11B to FIG. 11D are circuit diagrams showing the types of charge pump circuits and regulators necessary for generating the potentials which are to be applied to a memory cell in respective operation modes shown in TABLE 1.
Figure 11C:
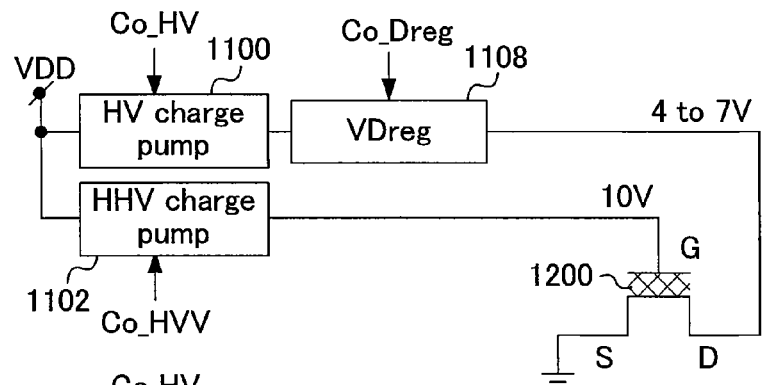
Figure 11D:
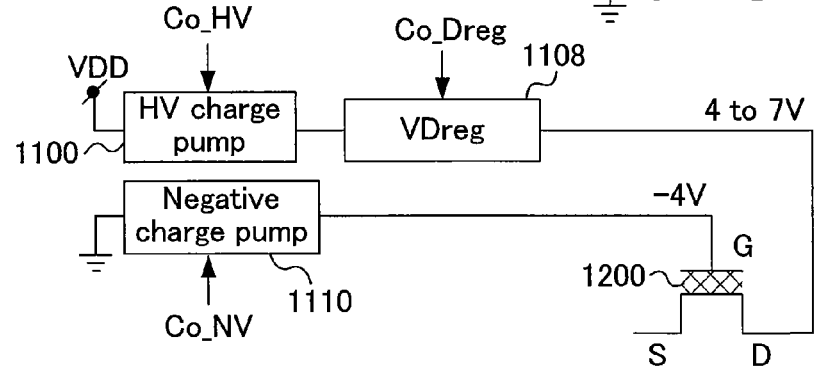

FIG. 4 shows a circuit structure example of a principal part of a flash memory (semiconductor memory device) 400 of embodiment 2 including the MONOS cells of FIG. 9. It should be noted that a plurality of word lines are generically referred to as "word lines WL" so long as they do not need to be distinguished from one another, and that a plurality of bit lines are generically referred to as "bit lines BL" so long as they do not need to be distinguished from one another.

Referring to FIG. 4, the semiconductor memory device of this embodiment includes: a memory cell array 402 including a number of memory cells arranged in rows and columns for storing information; a plurality of word lines WL0, WL1 extending in the row direction, each of which is connected to the control gates of the memory cells of a corresponding memory cell row; a plurality of bit lines BL0, BL1, BL2 and BL3 extending in the column direction and connected to the sources or drains of the memory cells; a row decoder 414 connected to the word lines WL for selecting the memory cells of any row; a column selection gate 406 connected to the bit lines BL and being under the control of a column decoder 416; a source-drain selection gate 407 which is under the control of a source-drain decoder 418 to be connected to the bit lines BL via the column selection gate 406; a data writing circuit 412 for supplying a potential to the source or drain of a memory cell via a reading bias transistor 105; a drain potential regulator 108 for supplying a potential to the data writing circuit 412; a negative potential generation circuit 110 for supplying a negative potential to the row decoder 414; a multiplexer 422 for selecting any of the output potential of the positive charge pump circuit 102 and the output potential of the gate potential regulator 106 to supply the selected potential to the row decoder 414; a switch 112 interposed between the row decoder 414 and the multiplexer 422; a gate potential regulator 106 for setting a potential which is to be supplied to the control gate of the memory cell; a multiplexer 424 for supplying a potential to the source-drain decoder 418 and the column decoder 416; a positive charge pump circuit 102 for supplying a driving potential to the multiplexer 424, the gate potential regulator 106, the multiplexer 422, and the drain potential regulator 108; a detection circuit 428 for detecting a potential which is to be supplied to the row decoder 414; and a control circuit 426 for receiving the output of the detection circuit 428.

Figure 12:
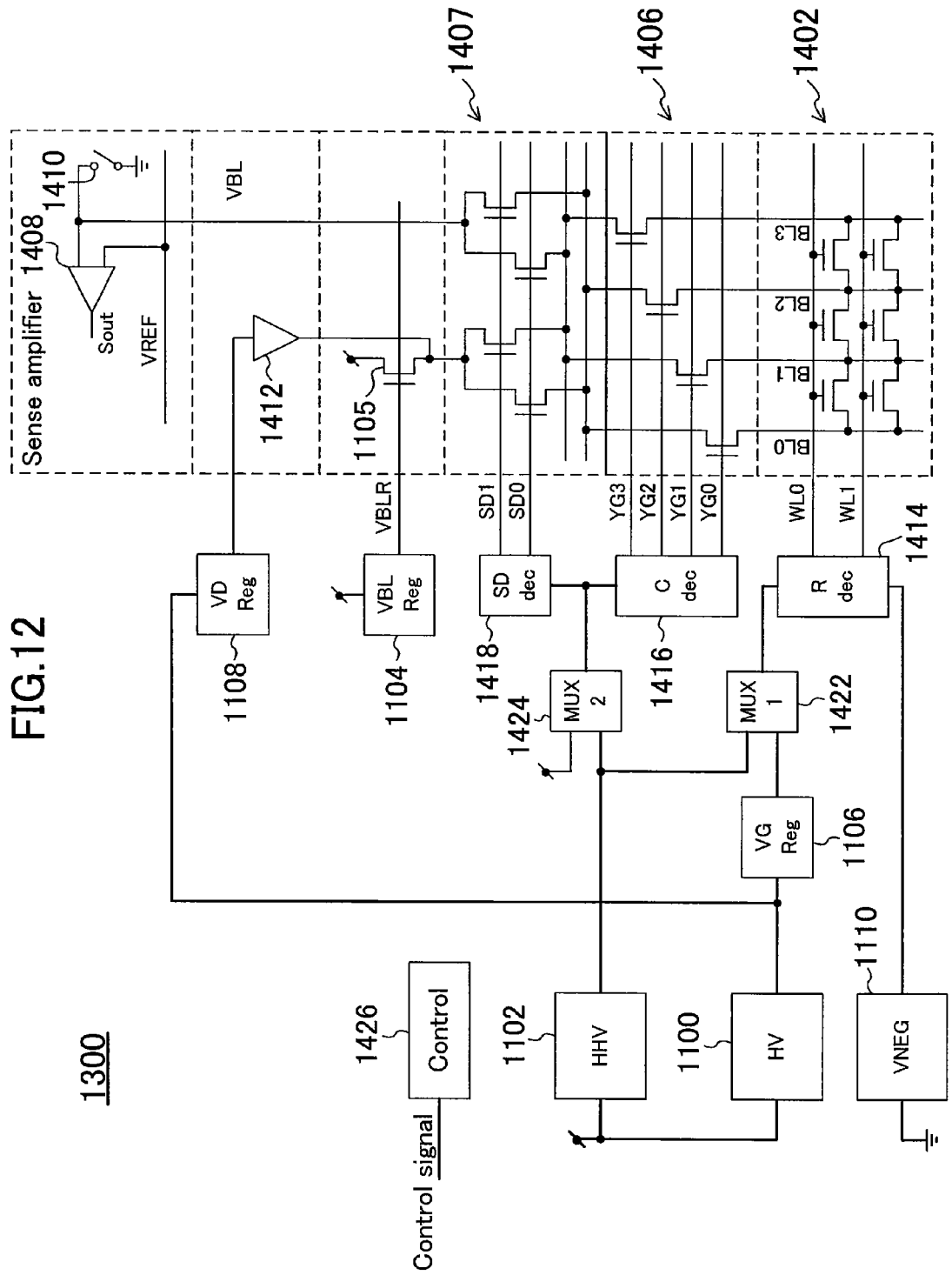
FIG. 12 shows an example of the circuit structure of a flash memory which includes the MONOS cells shown in FIG. 9.

The memory cell array 402 illustrated in FIG. 4 has a virtual ground array (VGA) structure suitable to a bulk memory as in the conventional example of FIG. 12.

In operation, the row decoder 414 selects any of the word lines according to an input address. The column selection gate 406 is controlled based on selection signals YG0 to YG3 that the column decoder 416 outputs according to the input address. The source-drain selection gate 407 is controlled based on selection signals SD0 and SD1 that the source-drain decoder 418 outputs according to the input address. Any of the bit lines is selected by the column decoder 416, the column selection gate 406, and the source-drain selection gate 407.

In the reading operation, writing verification operation and erasure verification operation, the negative potential generation circuit 110 is halted so that the output potential is at the level of the ground potential. The potential of about 4 V to 6 V, which is to be applied to the control gate of the selected memory cell, is set by the gate potential regulator 106 based on VHHV potential generated by the positive charge pump circuit 102 which is higher than the supply voltage. The multiplexer 422 selects the potential of about 4 V to 6 V to supply the selected potential to the positive-side power supply node of the row decoder 414, whereby the selected word line is set to the potential of about 4 V to 6 V. In the reading operation, writing verification operation and erasure verification operation, the switch 112 is conducting. The potential of about 1.3 V, which is to be applied to the drain of the selected memory cell, is derived from the potential generated by a bit line potential generation circuit 104 based on the supply voltage and supplied via the reading bias transistor 105, the source-drain selection gate 407 and the column selection gate 406. Reading of memory data from the memory cell is carried out by a sense amplifier 408 comparing the potential of the bit line BL selected via the column selection gate 406 and the source-drain selection gate 407 with reference potential VREF. The result of the comparison, Sout, is output to an external device.

In the writing operation, the negative potential generation circuit 110 is halted so that the output potential of the negative potential generation circuit 110 is at the level of the ground potential. Upon start of the writing operation, the multiplexer 422 selects the output potential of the positive charge pump circuit 102 and supplies the selected potential to the positive-side power supply node of the row decoder 414 via the switch 112 that is conducting. The output potential of the positive charge pump circuit 102 charges the positive-side power supply node of the row decoder 414 to about 10 V. The selection operation of the row decoder 414 which is carried out according to the input address signal leads to application of the potential of about 10 V to the control gate of the selected memory cell.

Application of the potential of about 4 V to 7 V to the drain of the selected memory cell is achieved by setting the switch 112 off so that the positive-side power supply node of the row decoder 414 is disconnected from the positive charge pump circuit 102 and then outputting a potential set by the drain potential regulator 108 based on the output potential of the positive charge pump circuit 102 to the data writing circuit 412. Then, the output potential of the data writing circuit 412 is supplied to the selected bit line via the source-drain selection gate 407 and the column selection gate 406. Meanwhile, the supply voltage of the column decoder 416 and the source-drain decoder 418 is at the level of the output potential of the positive charge pump circuit 102 selected by the multiplexer 424, and the selection control signal potential of the column selection gate 406 and the source-drain selection gate 407 is at the level of the output potential of the positive charge pump circuit 102. With such, the potential of about 4 V to 7 V, which is the output of the data writing circuit 412, can efficiently be transmitted to the bit line. The source of the selected memory cell is grounded by turning on a switch 410 which is connected to the selected bit line via the source-drain selection gate 407 and the column selection gate 406. During the interval between t2 and t3 (see FIG. 2) where the channel current is supplied to the memory cell for the CHE writing operation, the potential of about 10 V which is to be applied to the control of the selected memory cell is retained by the charge of the positive-side power supply node of the row decoder 414 while the switch 112 is open. This operation does not affect the writing operation, which is now described below.

Figure 5:
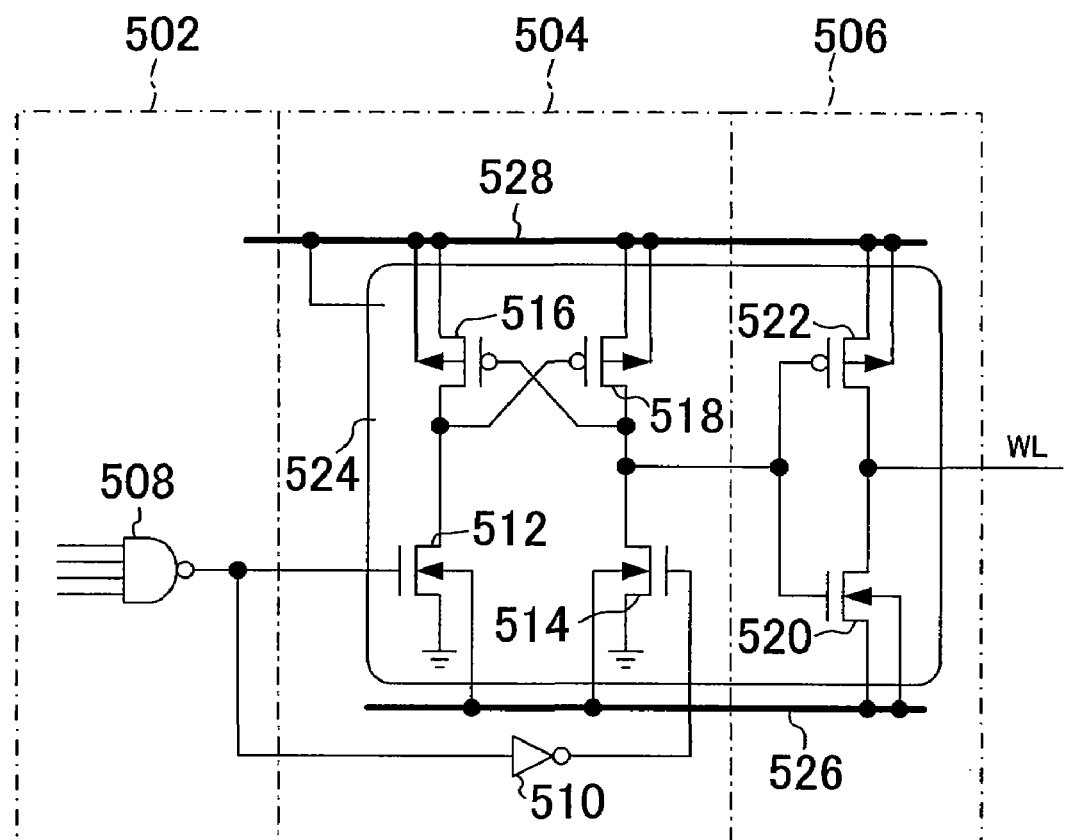
FIG. 5 shows a structure example of a selection circuit of a row decoder for one word line.

FIG. 5 shows a structure example of a selection circuit of the row decoder 414 for one word line. The selection circuit 500 includes a decoding section 502 for decoding an input address, a level shifter section 504 for converting the potential of the output of the decoding section 502 to a pumped potential, and a driver section 506 for driving the word line.

The decoding section 502 is formed by an NAND circuit 508 which decodes the input address and is typically designed to operate on external power supply potential VDD. The level shifter section 504 includes P-channel transistors 516 and 518 and N-channel transistors 512 and 514 between a positive-side power supply node 528 to which the pumped potential is applied and a negative-side power supply node 526 to which the ground or negative potential is applied, and an inverter 510 which operates on external power supply potential VDD. The driver section 506 includes a high breakdown voltage P-channel transistor 522 and N-channel transistor 520 which are connected in series between the positive-side power supply node 528 and the negative-side power supply node 526.

Since the pumped potential is applied to the transistors 512, 514, 516, 518, 520 and 522, these transistors have a withstanding structure. These transistors are also formed by using a triple well process in order to realize an operation on a negative voltage. The P-channel transistors are formed within an N-well, and the N-channel transistors are formed within a P-well. The N-well and P-well are formed within a deep N-well.

Referring to FIG. 5, the N-well which constitutes the substrate of the P-channel transistor and the deep N-well 524 are connected to the positive-side power supply node 528. The row decoder 414 includes the same number of selection circuit 500 as that of the word lines. Therefore, the parasitic capacitance of the positive-side power supply node 528 depends on the number of word lines and has the value of several hundreds of picofarads (pF). The only component which enables discharging of the parasitic capacitance is the leak current flowing from the positive-side power supply node 528. The decrease in potential at the positive-side power supply node 528 in the writing interval between t2 and t3 shown in FIG. 2, $\Delta V$, is expressed by the following formula (1):

$$\Delta V = IL \cdot tP / Cs \quad (1)$$

where IL is the leak current at the positive-side power supply node 528, tP is the data writing time extending between t2 and t3, Cs is the parasitic capacitance of the positive-side power supply node 528.

Considering that IL=1 µA, tP=10 µs, and Cs=500 pF, $\Delta V$=20 mV. The variation of $\Delta V$=20 mV in the control gate potential of the selected memory cell does not affect the writing operation.

In the erasure operation, the positive charge pump circuit 102 and the negative potential generation circuit 110 are activated. The negative voltage of about −4.5 V, which is to be applied to the control gate of the selected memory cell, is generated by the row decoder 414 from the output of the negative potential generation circuit 110 supplied to the negative-side power supply node of the row decoder 414 and is set as the potential of the selected word line. The potential of about 4 V to 7 V, which is to be applied to the drain of the selected memory cell, is derived from the potential that is generated by the drain potential regulator 108 from the output potential of the positive charge pump circuit 102. The potential generated by the drain potential regulator 108 is supplied to the data writing circuit 412, from which the potential is then supplied to the selected bit line via the source-drain selection gate 407 and the column selection gate 406. Meanwhile, the supply voltage of the column decoder 416 and the source-drain decoder 418 is at the level of the output potential of the positive charge pump circuit 102 selected by the multiplexer 424 as is in the writing operation. The source of the selected memory cell is rendered floating by turning off the switch 410 which is connected to the selected bit line via the source-drain selection gate 407 and the column selection gate 406.

The voltage generation control and timing control for switching of the charge pump circuits and multiplexers in the respective operation modes are realized based on an internal control signal output from a controller 426.

As described above, during the CHE writing operation, the positive-side power supply node of the row decoder is disconnected from the charge pump circuit after being charged to about 10 V, whereby the output voltage which needs to be kept at the time when the charge pump circuit supplies the memory cell channel current for the CHE writing operation can be set to a low value of about 4 V to 7 V, which is substantially equal to the level of the potential applied to the drain of the selected memory cell. Thus, during the supply of the channel current for CHE writing, it is not necessary to output a high voltage of about 10 V from the positive charge pump circuit 102. Therefore, the voltages necessary for a writing operation, i.e., the voltage of about 10 V which is to be applied to the control gate of the selected memory cell and the voltage of about 4 V to 7 V which is to be applied to the drain, can be generated by a single charge pump circuit. In this case, also, the increase in area of the charge pump circuit can be suppressed. The capacitance necessary for maintaining the voltage of about 10 V which is to be applied to the control gate can be secured by, for example, the parasitic capacitance that the positive-side power supply node 528 of the row decoder 414 necessarily has. Thus, it is not necessary to secure an additional area for the voltage-maintaining capacitance.

Embodiment 3

Described below in this section is a charge pump circuit structure example capable of efficient voltage generation, which is applied to a memory structure where one charge pump circuit supplies both the potential of about 10 V that is to be applied to the control gate of a memory cell selected in a writing operation and the potential of about 4 V to 7 V that is to be applied to the drain of the selected memory cell for supplying the channel current as described with reference to FIG. 1 and FIG. 4.

Figure 6A:
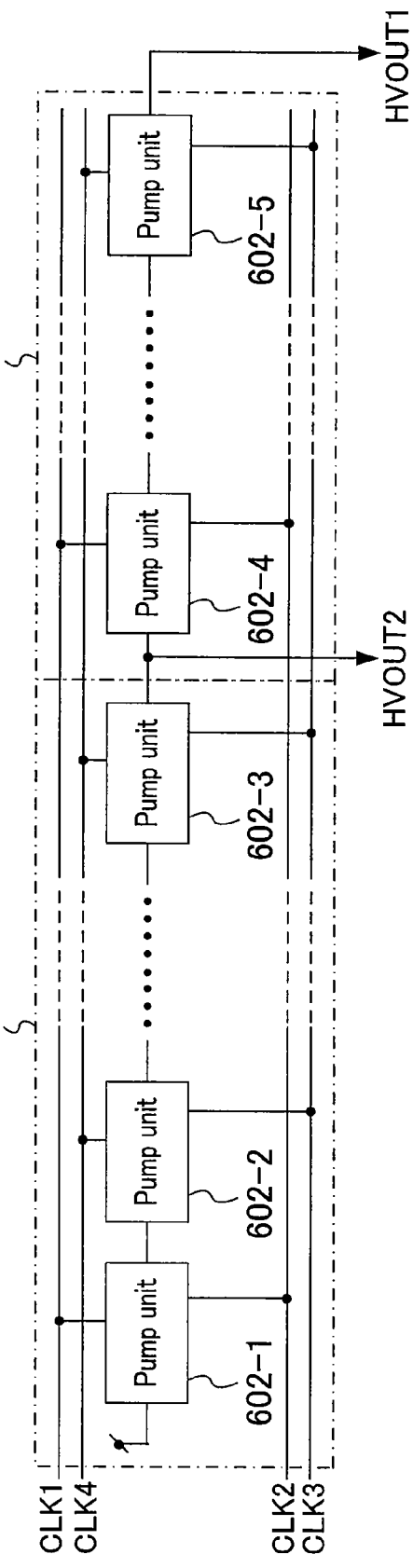
FIG. 6A shows a circuit diagram showing the structure of a charge pump circuit according to embodiment 3 of the present invention.

FIG. 6A shows a circuit diagram showing the structure of a charge pump circuit according to embodiment 3 of the present invention. The charge pump circuit shown in FIG. 6A is capable of generating a relatively high pumped potential (although the driving current necessary is small) and a relatively low pumped potential (although the driving current necessary is large).

Figure 6C:
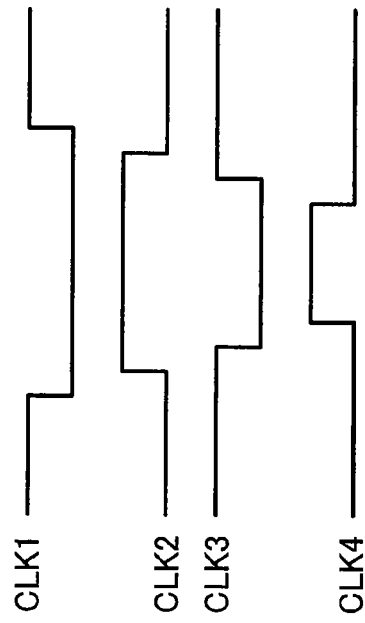
FIG. 6C is a waveform diagram illustrating clock signals used in the charge pump circuit of FIG. 6A.
Figure 6B:
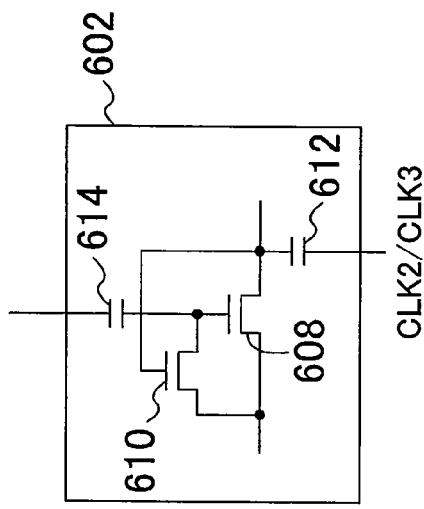
FIG. 6B is a circuit diagram showing the structure of a pump unit.

Referring to FIG. 6A, the charge pump circuit 600 of this embodiment includes a plurality of pump units 602-1 to 602-5 which are connected in series. Each of the pump units 602-1 to 602-5 has a circuit structure shown in FIG. 6B, including a charge transfer transistor 608, a pumping capacitor 612, a transistor 610, and a charge pump capacitor 614. The transistor 610 and the charge pump capacitor 614 operate to pump the gate potential of the charge transfer transistor 608. The pumping capacitor 612 and the charge pump capacitor 614 receive two-phase clocks shown in FIG. 6C (CLK2/CLK3 and CLK1/CLK4, respectively).

Considering a case where the positive charge pump circuit 102 of FIG. 4 is realized by the charge pump circuit 600 of FIG. 6A, final stage output HVOUT1 can be employed as the voltage for charging the positive-side power supply node of the row decoder 414 during the interval of the writing operation between t1 and t2 shown in FIG. 2. As a result, the potential of about 10 V can be applied to the memory cell selected in the writing operation. During the subsequent interval between t2 and t3, supply of the CHE writing channel current with the potential of 4 V to 7 V to the selected memory cell is carried out using intermediate stage output HVOUT2 while the positive-side power supply node of the row decoder 414 is disconnected from HVOUT1 output by the switch 112. With such a structure of the charge pump circuit 600 and voltage application control, output HVOUT2 requires a large current drivability, and therefore, the value of the pumping capacitor 612 of the pump units 602-1 to 602-3 of the pump block 604 is set to a value which secures the required current supply capacity.

Output HVOUT1 has a higher potential than output HVOUT2 but does not require a large current drivability. Therefore, the capacitance of the pumping capacitor 612 of the pump units 602-4 and 602-5 of the pump block 606 can be set to a value smaller than that of the pumping capacitor 612 of the pump units 602-1 to 602-3.

By thus realizing the positive charge pump circuit 102 of the memory circuit structure of FIG. 4 by the charge pump circuit 600 of FIG. 6A, both the potential of about 10 V which is to be applied to the control gate of the selected memory cell during the writing operation and the potential of about 4 V to 7 V which is to be applied to the source can be generated by one charge pump circuit. Further, the size of the charge pump circuit which generates the two levels of potentials can be decreased as compared with the conventional one.

Embodiment 4

Figure 7:
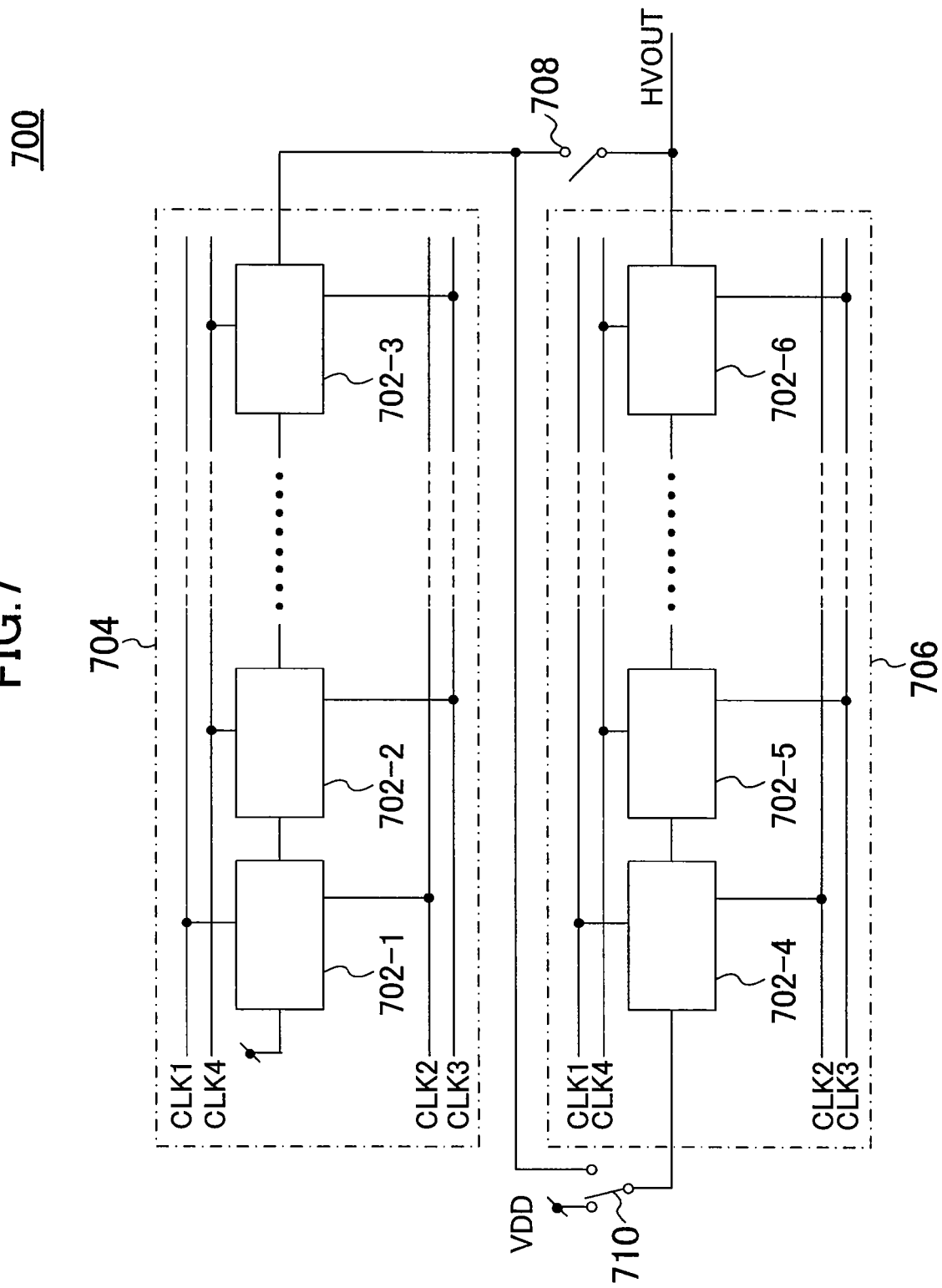
FIG. 7 shows an example of the structure of a charge pump circuit according to embodiment 4 of the present invention.

FIG. 7 shows an example of the structure of a charge pump circuit according to embodiment 4 of the present invention. The charge pump circuit 700 of this embodiment switches the configuration according to the operation state such that the size of the power supply circuit is reduced.

The charge pump circuit 700 includes a pump block 704 and a pump block 706. The pump block 704 includes pump units 702-1 to 702-3 which are connected in series. The pump block 706 includes pump units 702-4 to 702-6 which are connected in series. Each of the pump units 702-1 to 702-6 may have the structure shown in FIG. 6B, for example. In this case, the pump units 702-1 to 702-6 are driven by the clock signals of FIG. 6C. The charge pump circuit 700 also includes a switch 708 which, when conducting, connects the pump block 704 and the pump block 706 in parallel and a switch 710 which, when conducting, connects the pump block 704 and the pump block 706 in series.

In the interval of the writing operation between t1 and t2 shown in FIG. 2, the positive-side power supply node of the row decoder 414 is charged in order to apply the potential of about 10 V to the selected memory cell. This charging of the positive-side power supply node is carried out while, in the charge pump circuit 700 of FIG. 7, the switch 708 is open but the switch 710 is connected to the output side of the pump unit 702-3. The switches 708 and 710 enable series connection of the pump block 704 and the pump block 706. Output HVOUT is a high voltage, and output HVOUT in this operation state is employed for charging the positive-side power supply node of the row decoder 414, whereby the potential of about 10 V can be applied to the control gate of the selected memory cell.

During the subsequent interval between t2 and t3, the process of supplying the CHE writing channel current with the potential of 4 V to 7 V to the selected memory cell is carried out while the positive-side power supply node of the row decoder 414 is disconnected from HVOUT output by the switch 112 (see FIG. 4). This process is carried out while, in the charge pump circuit 700 of FIG. 7, the switch 708 is conducting and the switch 710 is connected to the supply voltage VDD side. This state of the switches 708 and 710 lead to parallel connection of the pump block 704 and the pump block 706, so that a potential output of about 4 V to 7 V with a large current drivability can be achieved for output HVOUT. In this state, the potential of about 10 V which is to be applied to the control gate of the selected memory cell is secured by the charge retained at the positive-side power supply node of the row decoder 414. The charge pump circuit 700 does not need to output this potential of about 10 V.

When the capacitance of the pumping capacitor 612 (see FIG. 6B) of the pump units 602-1 to 602-3 of the pump blocks 704 and 706 connected in parallel has such a value that the capacity of supplying the channel current for CHE writing is secured, charging of the positive-side power supply node of the row decoder 414 with the intention of supplying the potential of about 10 V to the control gate of the selected memory cell can be realized only by changing the configuration of the charge pump structure by switching the switch 708 and the switch 710. Therefore, an additional pump unit for generating the potential of about 10 V is not necessary.

With the structure of the charge pump circuit 700 of FIG. 7 employed for the positive charge pump circuit 102 of the memory circuit structure of FIG. 4, both the potential of about 10 V which is to be applied to the control gate of the selected memory cell in the writing operation and the potential of about 4 V to 7 V which is to be applied to the source can be generated by one charge pump circuit. The size of the charge pump circuit can further be decreased.

Embodiment 5

Figure 8:
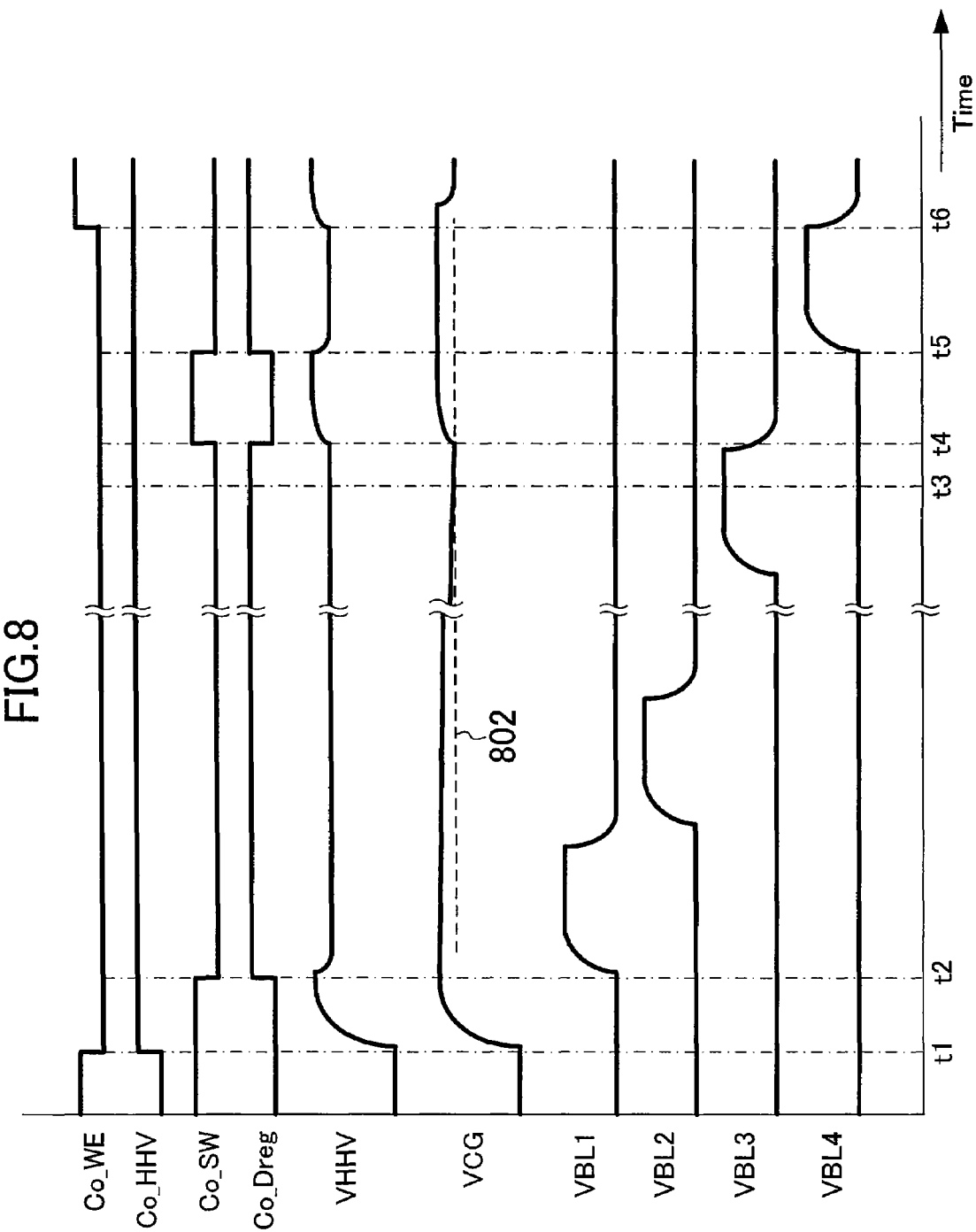
FIG. 8 is a waveform diagram which illustrates a driving method in data writing of a semiconductor memory device according to embodiment 5 of the present invention.

FIG. 8 is a waveform diagram which illustrates a driving method in data writing of a semiconductor memory device according to embodiment 5 of the present invention. According to the method of this embodiment, even in an operation of sequentially selecting memory cells connected to a same word line for continuous writing, such as page mode writing operation, the potential of about 10 V which is to be applied to the control gate can be maintained. In an example described below, the method of this embodiment is applied to the circuit structure of the semiconductor memory device of FIG. 4.

At time t1, write control signal Co_WE transitions to "L" level so that the operation is set to the data writing mode, and control signal Co_HHV of the positive charge pump circuit transitions to "H" level so that the positive charge pump circuit 102 starts a pumping operation. As a result, the output potential of the positive charge pump circuit 102, VHHV, increases. Meanwhile, the control signal of the switch 112, Co_SW, transitions to "H" level so that the switch 112 becomes conducting. As a result, the positive-side power supply node of the row decoder 414 is charged to about 10 V. Thus, control gate potential VCG is set to a high voltage of about 10 V as is the output of the positive charge pump circuit 102, VHHV. At time t2 where the positive-side power supply node of the row decoder 414 is charged to a high voltage of about 10 V, the control signal of the switch 112, Co_SW, transitions to "L" level so that the switch 112 is opened. Concurrently, the control signal of the drain potential regulator, Co_Dreg, transitions to "H" level, and a high voltage of about 4 V as the stepped voltage for the CHE writing is applied to the bit line BL1 to which the drain of the selected memory cell is connected for the first writing, as depicted by the waveform of VBL1. With such a voltage being applied, the channel current for the CHE writing is supplied from the positive charge pump circuit 102 to a memory cell to which data is to be written via the drain potential regulator 108, and the writing operation in the selected memory cell is carried out for the first writing.

Subsequently, for the second writing, a high voltage of about 4 V as the stepped voltage for the CHE writing is applied to the bit line BL2 to which the drain of the selected memory cell is connected, as depicted by the waveform of VBL2, and the second writing operation in the selected memory cell is carried out. Likewise, for the third writing, a high voltage of about 4 V as the stepped voltage for the CHE writing is applied to the bit line BL3 to which the drain of the selected memory cell is connected, as depicted by the waveform of VBL3, and the third writing operation in the selected memory cell is carried out subsequent to the second writing operation.

In such a sequence of writing with sequential selection of memory cells, the charge at the positive-side power supply node of the row decoder 414 is gradually discharged due to current leakage occurring at the positive-side power supply node, so that control gate potential VCG gradually decreases. With such a decrease in control gate potential VCG, the sufficient writing characteristics could not be obtained even by applying the stepped voltage to the drain of the memory cell, and the number of writing cycles necessary for changing the threshold of the memory cell to an intended level would greatly increase.

To avoid such an undesirable consequence, in the semiconductor memory device of FIG. 4, the detection circuit 428 for detecting the potential at the positive-side power supply node of the row decoder 414 is connected between the switch 112 and the positive-side power supply node of the row decoder 414. The detection circuit 428 detects a decrease of control gate potential VCG to a detection level represented by broken line 802 to output a detection signal 430 to the control circuit 426.

At time t3, the detection signal 430 is input to the control circuit 426, and accordingly, the control circuit 426 lowers the control signal of the drain potential regulator, Co_Dreg, to "L" level at time t4 where the writing operation which is being carried out at time t3 ends, whereby application of the stepped voltage to the memory cell is halted. Concurrently, the control signal of the switch 112, Co_SW, is changed to "H" level so that the switch 112 becomes conducting, whereby the positive-side power supply node of the row decoder 414 is charged by the positive charge pump circuit 102. Then, to start the writing operation in the selected memory cell from time t5 where the positive-side power supply node of the row decoder 414 is sufficiently charged, control signal Co_SW is changed to "L" level so that the switch 112 is opened, and drain potential regulator control signal Co_Dreg is changed to "H" level, whereby the stepped voltage is applied to the bit line VBL4 connected to the source of a next memory cell to which data is to be written. At time t6, write control signal Co_WE transitions to "H" level so that the page writing cycle ends.

Thus, in the driving method of this embodiment, in a semiconductor memory device which includes the detection circuit 428 for detecting the potential at the positive-side power supply node of the row decoder 414, the control circuit 426 controls the writing operation based on the detection signal 430 output from the detection circuit 428. With these features, both the potential of about 10 V which is to be applied to the control gate of the selected memory cell in the writing operation and the potential of about 4 V to 7 V which is to be applied to the drain can be generated by one charge pump circuit. In addition, the page writing operation of sequentially performing the writing operation in memory cells connected to a same word line can be realized using a small size charge pump circuit.

As described above, a semiconductor memory device and a voltage controller of the semiconductor memory device of the present invention are applicable to MONOS flash memory cells, floating gate type flash memory cells, and the like, which employ a writing scheme that requires a large current drivability of a charge pump circuit, such as CHE writing scheme.

What is claimed is:

1. A semiconductor memory device, comprising:
   a memory cell array including a plurality of memory cells arranged in rows and columns for holding information, each of the memory cells having a control gate;
   a plurality of word lines extending in a row direction, each of the word lines being connected to the control gates of the memory cells of a corresponding row of the memory cell array;
   a plurality of bit lines extending in a column direction and connected to sources or drains of the memory cells;
   a charge pump circuit for generating a voltage higher than a supply voltage;
   a row decoder for receiving a first output voltage of the charge pump circuit, selecting any of the plurality of word lines, and supplying the first output voltage to the selected word lines;
   a column decoder for selecting any of the plurality of bit lines;

a writing circuit supplied with a second output voltage of the charge pump circuit and configured to output a writing potential to one of the plurality of bit lines selected by the column decoder according to input data which is to be written;

a first switch located in a connection path between the row decoder and the charge pump circuit; and a control circuit for controlling an operation timing of the writing circuit and the first switch.

2. The semiconductor memory device of claim 1, further comprising a voltage regulator between the charge pump circuit and the writing circuit.

3. The semiconductor memory device of claim 1, wherein, in writing of the data in the memory cell, the first switch is conducting for a predetermined time interval so that a power supply node of the row decoder is charged and thereafter becomes nonconducting.

4. The semiconductor memory device of claim 3, wherein the control circuit outputs a control signal such that the output of the charge pump circuit pumped after the first switch becomes nonconducting is supplied to the selected bit line.

5. The semiconductor memory device of claim 3, further comprising a negative potential generator circuit for supplying a negative potential to the row decoder.

6. The semiconductor memory device of claim 3, further comprising a detector circuit for detecting a potential supplied to the row decoder to output a result of the detection to the control circuit, wherein if, in writing of the data in the memory cell, the potential supplied to the row decoder falls to or below a predetermined value after the first switch becomes nonconducting, the control circuit makes the first switch conducting so that the power supply node of the row decoder is charged.

7. The semiconductor memory device of claim 1, wherein the charge pump circuit includes:

a first pump block including a plurality of first pump units connected in series for pumping an input voltage and an output section, each of the first pump units having a first pumping capacity; and a second pump block including a plurality of second pump units connected in series for pumping an input voltage and an output section, each of the second pump units having a second pumping capacity.

8. The semiconductor memory device of claim 7, wherein:

the second pumping capacity is smaller than the first pumping capacity, and the output section of the first pump block is connected to an input section of the second pump block; and an output potential of the second pump block is supplied to the row decoder in a writing operation, and an output potential of the first pump block is supplied to the selected bit line via the writing circuit.

9. The semiconductor memory device of claim 7, wherein the charge pump circuit further includes a second switch for connecting the first pump block and the second pump block in series, and a third switch provided between the output section of the first pump block and the output section of the second pump block, the second switch and the third switch being used to switch whether the second pump block is connected to the first pump block in series or in parallel.

10. The semiconductor memory device of claim 1, wherein the charge pump unit is provided as a single unit in the semiconductor memory device.

11. A method for driving a semiconductor memory device that includes a memory cell array including a plurality of memory cells arranged in rows and columns for holding information, each of the memory cells having a control gate, a plurality of word lines extending in a row direction, each of the word lines being connected to the control gates of the memory cells of a corresponding row of the memory cell array, a plurality of bit lines extending in a column direction and connected to sources or drains of the memory cells, a charge pump circuit for generating a voltage higher than a supply voltage, a row decoder for receiving a first output voltage of the charge pump circuit, selecting any of the plurality of word lines and supplying the first output voltage to the selected word line, a column decoder for selecting any of the plurality of bit lines, a writing circuit supplied with a second output voltage of the charge pump circuit and configured to output a writing potential to one of the plurality of bit lines selected by the column decoder according to input data which is to be written, a switch located in a connection path between the row decoder and the charge pump circuit, and a control circuit for controlling an operation timing of the writing circuit and the switch, the method comprising the steps of:

(a) in preparation for writing of data in the memory cell, making the switch conducting to charge a power supply node of the row decoder; and (b) after step (a), making the switch nonconducting to supply a pumped output of the charge pump circuit to the selected word line for writing of data.

12. The method of claim 11, wherein the semiconductor memory device further includes a detector circuit for detecting a potential supplied to the row decoder to output a result of the detection to the control circuit, and step (b) includes (b1) sequentially and continuously writing the data in the memory cells selected by the row decoder, and (b2) if the potential supplied to the row decoder falls to or below a predetermined value, making the switch conducting so that the power supply node of the row decoder is charged before writing of the data in the memory cells.

13. The method claim 11, wherein the charge pump unit is provided as a single unit in the semiconductor memory device.

* * * * *